United States Patent [19]

Schultz

[11] Patent Number: 4,554,664
[45] Date of Patent: Nov. 19, 1985

[54] STATIC MEMORY CELL WITH DYNAMIC SCAN TEST LATCH

[75] Inventor: Dale E. Schultz, Burnsville, Minn.

[73] Assignee: Sperry Corporation, New York, N.Y.

[21] Appl. No.: 539,599

[22] Filed: Oct. 6, 1983

[51] Int. Cl.[4] .................. G01R 31/28; G06F 11/00
[52] U.S. Cl. .................................. 371/25; 324/73 R
[58] Field of Search ............... 364/73.7, 716; 371/21, 371/25; 324/73 R, 73 AT; 307/291, 446, 480, 350, 351, 358

[56] References Cited

U.S. PATENT DOCUMENTS

| | | | |
|---|---|---|---|
| 4,071,902 | 1/1978 | Eichelberger et al. | 364/716 |
| 4,074,851 | 2/1978 | Eichelberger et al. | 371/25 |
| 4,298,980 | 11/1981 | Hajdu et al. | 371/25 |
| 4,467,431 | 10/1984 | Blum | 324/73 R |
| 4,477,738 | 10/1984 | Kouba | 307/73 R X |
| 4,499,579 | 2/1985 | Still et al. | 371/25 X |

OTHER PUBLICATIONS

McAnney, Method for Sampling Test Points in Logic Circuits, Feb. 1983, IBM Technical Disclosure Bulletin, vol. 25, No. 9, p. 4519.

Primary Examiner—Charles E. Atkinson
Attorney, Agent, or Firm—Kenneth T. Grace; Marshall M. Truex

[57] ABSTRACT

A level sensitive scan design (LSSD) Latch Cell that is adaptable to very large scale integrated (VLSI) Semiconductor circuit fabrication is disclosed. The Latch Cell includes a static functional latch and a dynamic test latch, both of which are controlled by a data selector that selects input data from either a functional data source or test data from another test latch in a scan data path.

3 Claims, 8 Drawing Figures

STATIC MEMORY CELL WITH DYNAMIC SCAN TEST LATCH

BACKGROUND OF THE INVENTION

1. Field of the Invention

The present invention is directed toward very large scale integrated (VLSI) semiconductor circuit chips and in particular to on-chip test circuits that are provided to maintain and test the functional circuits.

2. Description of the Prior Art

In the prior art it is known that the denser the concentration of functional circuits on a semiconductor chip becomes the more urgent is the need to provide means for the maintenance and testability. The ability to put thousands of circuits on a single chip of silicon offers great potential for reducing power, increasing speed and dramatically reducing the cost of digital circuits. Unfortunately, several serious problems must be solved before this potential can be realized.

A general method of design for testability of VLSI semiconductor circuit chips that is utilized to achieve this goal combines two concepts that are almost independent. This method, called Level Sensitive Scan Design (LSSD) is well known and has been described in several publications including:

A Logic Design Structure for LSI Testability, E. B. Eichelberger, et al, 14th Annual Design Automation Conference, New Orleans, June 1977, pages 462–467;

LSI Chip Design for Testability, E. B. Eichelberger, et al, 1978 IEEE International Solid State Circuits Conference, February 1978, pages 216–217;

Level-Sensitive Scan Design Tests Chips, Boards, System, N. C. Berglund, Electronics, Mar. 15, 1979, pages 108–110.

The first concept is to design the circuitry in its logic structure so that correct operation is not dependent on rise time, fall time, or minimum delay of the individual circuit. The only dependence is that the total delays to a number of levels be less than some known value. The second concept is to design all the internal storage elements (other than memory arrays) so that they can also operate as shift legister latches (SRL). These prior art LSSD, VLSI logic systems or SRLs have been comprised of a plurality of static functional latches, each having an associated static test latch. A static latch is defined as a latch circuit that does not store information as a presence or absence of charge on a capacitor, and consequently, does not require that the latch circuit be refreshed to retain the information. The static latch uses a stationary charge of electricity to retain the present state of the latch as in a configuration of cross-coupled transistor circuits to form a bistable flip-flop.

Because fewer transistors are required to construct a dynamic latch than to construct a static latch and because a large number of latches are formed on a VLSI chip, it is highly desirable to use a dynamic latch to substantially reduce the number of transistors per VLSI chip while performing the same test functions. A dynamic latch is defined as a latch circuit that uses the presence or absence of a charge on a capacitor to store information in which the charge must be recharged or refreshed to retain the information. Although dynamic latches are well known, their use in LSSD VLSI logic systems has not been implemented because the functional latch is essentially a static operating condition device. However, I have determined that because scan operations are always performed in bursts, that is in a series of continuous clock cycles, the scan operation can be performed using dynamic scan latches, even though static functional latch operating conditions exist.

SUMMARY OF THE INVENTION

The present invention is directed toward a LSSD latch cell that is particularly adaptable to VLSI semiconductor circuit fabrication on a single chip of, e.g., silicon. The latch cell is comprised of a static functional latch and a dynamic test latch, both of which are controlled by a data selector that alternatively selects input data from either a functional data source or a test data source. The preferred VLSI semiconductor fabrication uses MOS processes and includes transmission circuits or transfer gates as the primary gating logic.

DESCRIPTION OF THE PREFERRED EMBODIMENT

Figure 1:
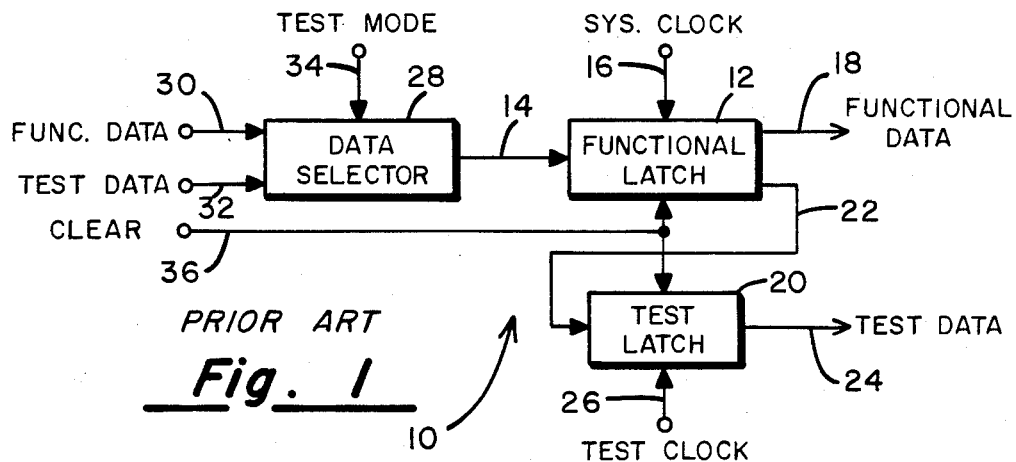
FIG. 1 is an illustration of a block diagram of a prior art LSSD latch cell.

With particular reference to FIG. 1, there is presented an illustration of the block diagram of a prior art LSSD latch cell 10. Latch cell 10 is comprised of a functional latch 12, which holds the functional data stored in latch cell 10 when gated therein from line 14 by a System Clock Signal on line 16 and which couples the functional data to Functional Data out line 18. Test latch 20 receives, via line 22, a replication of the functional data held in functional latch 12. The functional data held in test latch 20 is coupled to the Test Data out line 24 when clocked by the Test Clock signal coupled to line 26. A data selector 28 selects either the function mode—Function Data on line 30—or the test mode—Test Data on line 32—as determined by the Test Mode signal on line 34. Both functional latch 12 and test latch 20 are cleared by a Clear signal on line 36.

Figure 2:
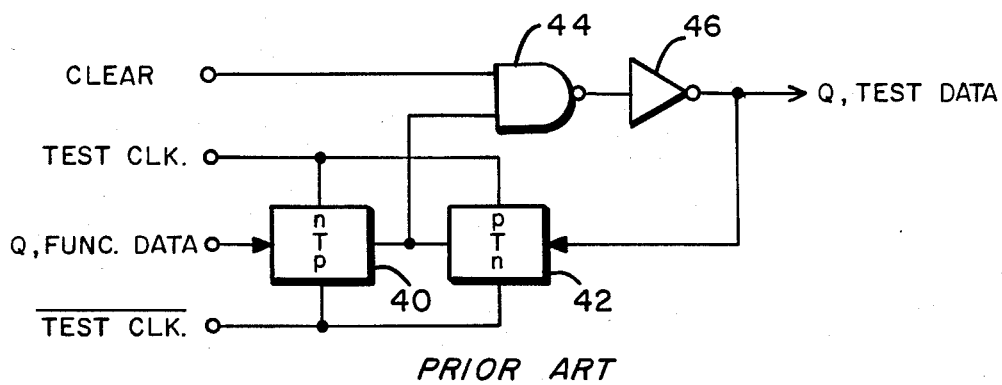
FIG. 2 is an illustration of a prior art LSSD static test latch that is implemented in CMOS technology.

With particular reference to FIG. 2 there is illustrated a prior art static test latch fabricated in CMOS technology that uses 10 transistors; 2 transistors for each transmission switch or transfer gate 40 and 42; 4 transistors for the two input NAND gate 44; and, two transistors for the inverter 46. Transfer gates 40, 42 each consist of an n-channel and a p-channel transistor configured to function as an analog digital switch. When the n input is Hi and the p input is Lo the switch is ON (shorted). Complementary Clock Signals are applied to the n and the p inputs; thus, when the n input is Lo, the p input is Hi and the switch is OFF (open). See the text Basic Integrated Circuit Engineering, D. J. Hamilton, et al, McGraw-Hill Book Co., copyright 1976, pages 530-578.

Figure 3:
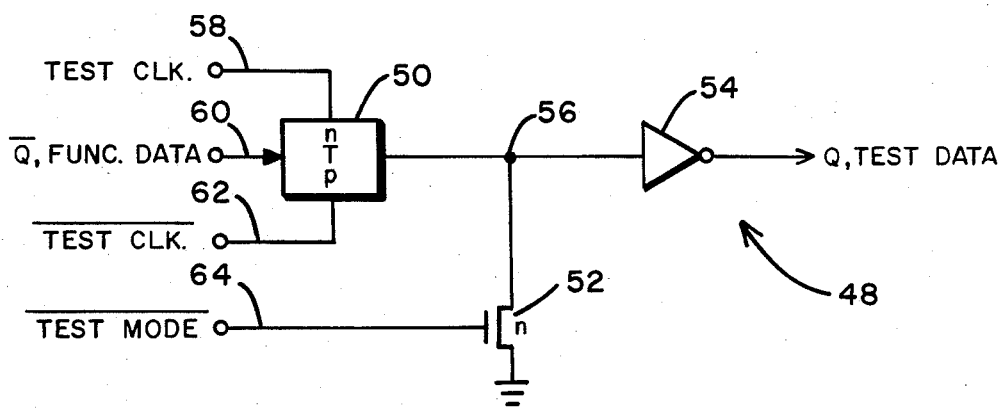
FIG. 3 is an illustration of an LSSD dynamic latch, implemented in CMOS technology, that may be utilized in the LSSD latch cell of the present invention.

With particular reference to FIG. 3, there is illustrated a dynamic test latch 48 fabricated in CMOS technology that uses only five transistors; 2 transistors for the transfer gate 50; 1 transistor for the pull-down transistor 52; and, 2 transistors for the inverter 54. Pull-down transistor 52 drives the input at mode 56 to ground (Lo) when the dynamic test latch is not in the test mode. When the dynamic test latch is in the test mode, pull-down transistor 52 functions as an open switch and data to the inverter 54 comes from transistor gate 50. If the Test Clock signal on line 58 is active (Hi) the functional data transfers through gate 50 to inverter 54. When the Test Clock signal on line 58 goes inactive (Lo), transfer gate 50 functions as an open switch and the capacitance of node 56, plus the input capacitance of inverter 54, stores the Lo or the Hi input logic state from line 60 until the Test Clock signal on line 58 again goes active (Hi). Pull-down transistor 52 is utilized in dynamic test latch 48 to prevent inverter 54 from drawing current when not in the test mode of operation. Note, the Test Clock Signal goes active (Hi) only when the Test Mode signal is also active (Hi).

Figure 4:
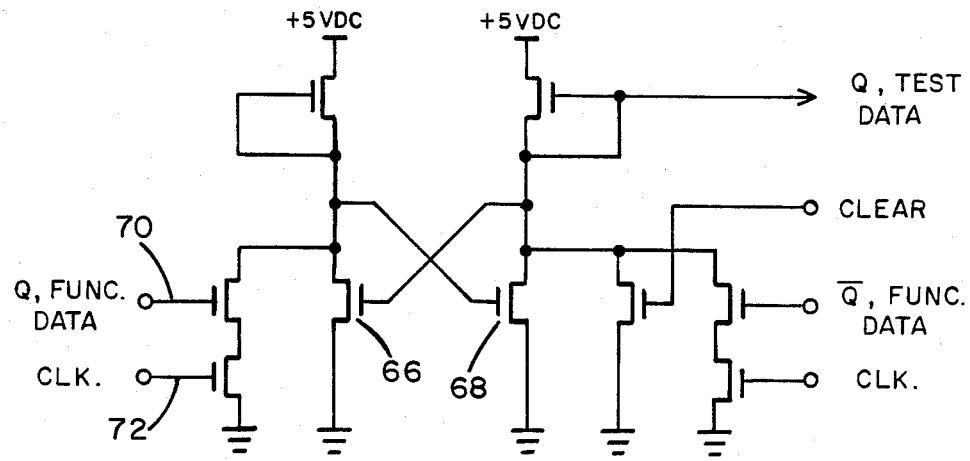
FIG. 4 is an illustration of a prior art LSSD static test latch that is implemented in NMOS technology.

With particular reference to FIG. 4 there is illustrated a prior art static test latch fabricated in NMOS technology that uses 9 transistors. In this prior art configuration, the latch that is formed by the cross-coupled transistors 66 and 68 is loaded with functional data on line 70 when the Clock Signal on line 72 goes active (Hi).

Figure 5:
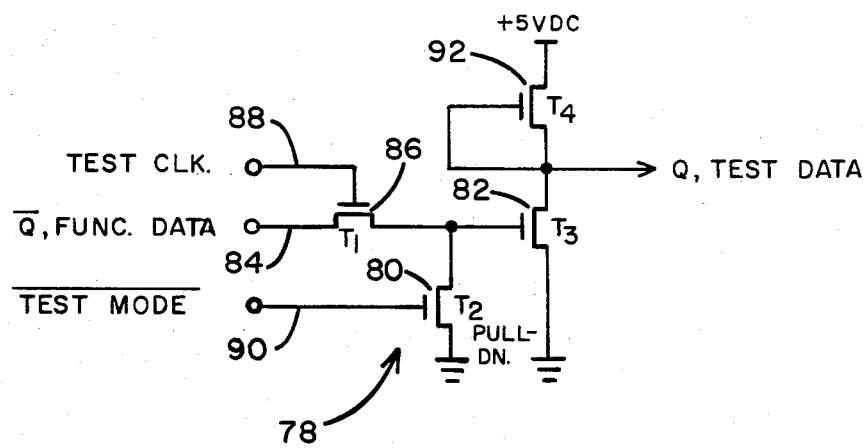
FIG. 5 is an illustration of an LSSD dynamic test latch that is implemented in NMOS technology that may be utilized in the LSSD latch cell of the present invention.

With particular reference to FIG. 5 there is illustrated a dynamic test latch 78 fabricated in NMOS technology that uses only 4 transistors. In this configuration of the dynamic test latch, pull-down transistor 80 drives the gate of transistor 82 to ground (Lo) when not in the test mode. When in the test mode when Test Mode signal is active (Hi) and when the Test Clock signal is also active (Hi), the pull-down transistor 80 functions as an open switch and functional data on line 84 passes through transistor 86 to the gate of transistor 82. When the Test Clock signal goes inactive (Lo), the pass transistor 86 functions as an open switch and the gate capacitance of transistor 82 plus the interconnect capacitance stores the Lo or Hi logic state from line 84 at the gate of pass transistor 86 until the Test Clock signal on line 88 again goes active (Hi). Pull-down transistor 80 is used in this dynamic test latch to prevent the inverter formed by transistors 82 and 92 from drawing current from the plus 5 volt DC source when not in the test mode of operation.

Figure 6:
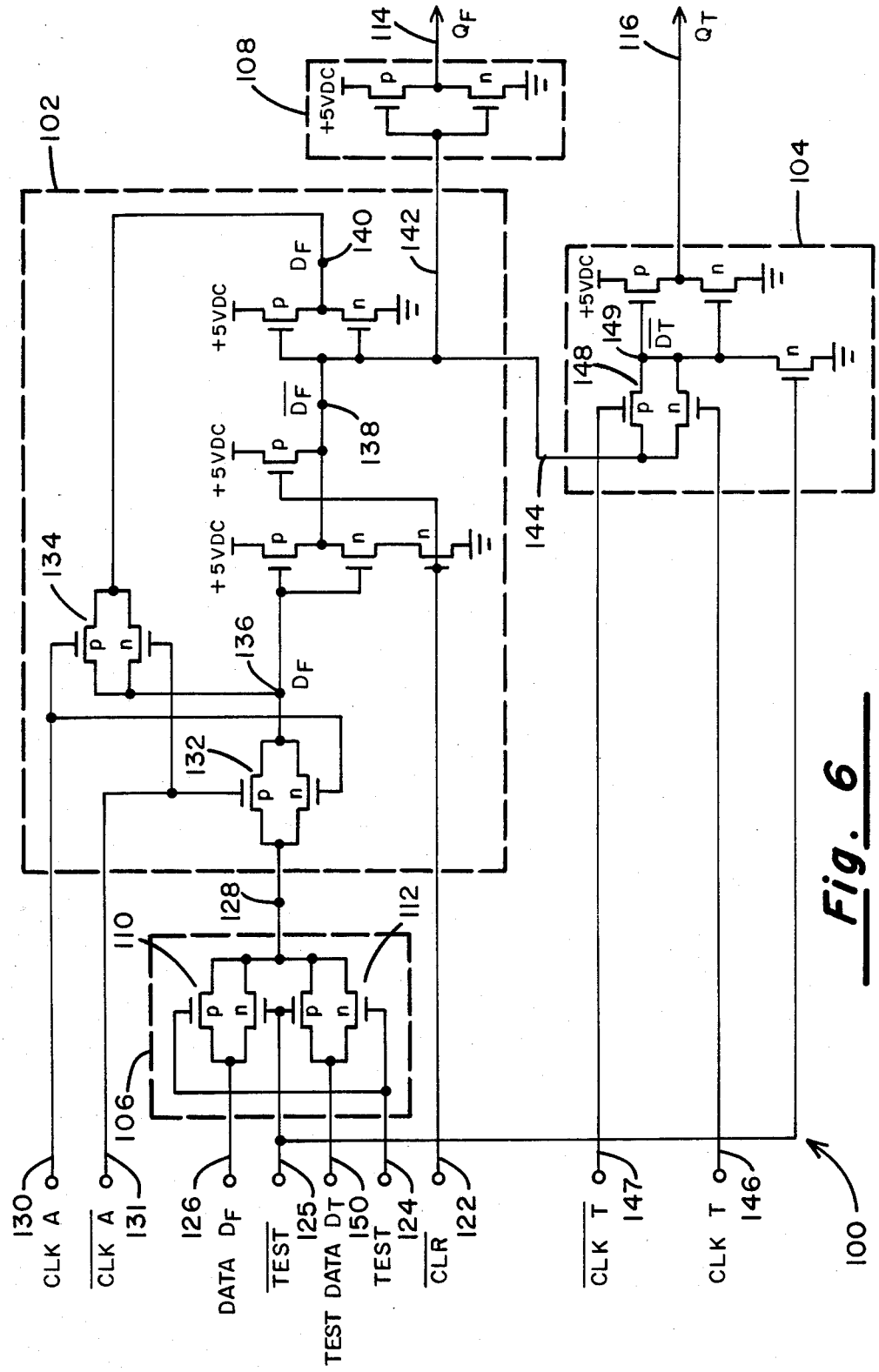
FIG. 6 is an illustration of the circuit diagram of a preferred VLSI embodiment of the latch cell of the present invention.

With particular reference to FIG. 6 there is presented an illustration of a preferred VLSI embodiment of the latch cell 100 of the present invention. Latch cell 100 is comprised of the static functional latch 102, the dynamic test latch 104, the data selector 106 and the inverter 108. In this preferred embodiment of applicant's LSSD latch cell 100, the semiconductor technology employed is CMOS with functional latch 102 being a static latch and with test latch 104 being a dynamic latch, such as being illustrated in FIG. 3. Data selector 106 is comprised of two transfer gates 110 and 112 that form a multiplexer for the alternative selection of input data $D_F$ from either a functional data source, e.g., logic circuit 118 of FIG. 7, or Test Data $D_T$ from a test data source, e.g., test data source 120 of FIG. 7.

Figure 7:
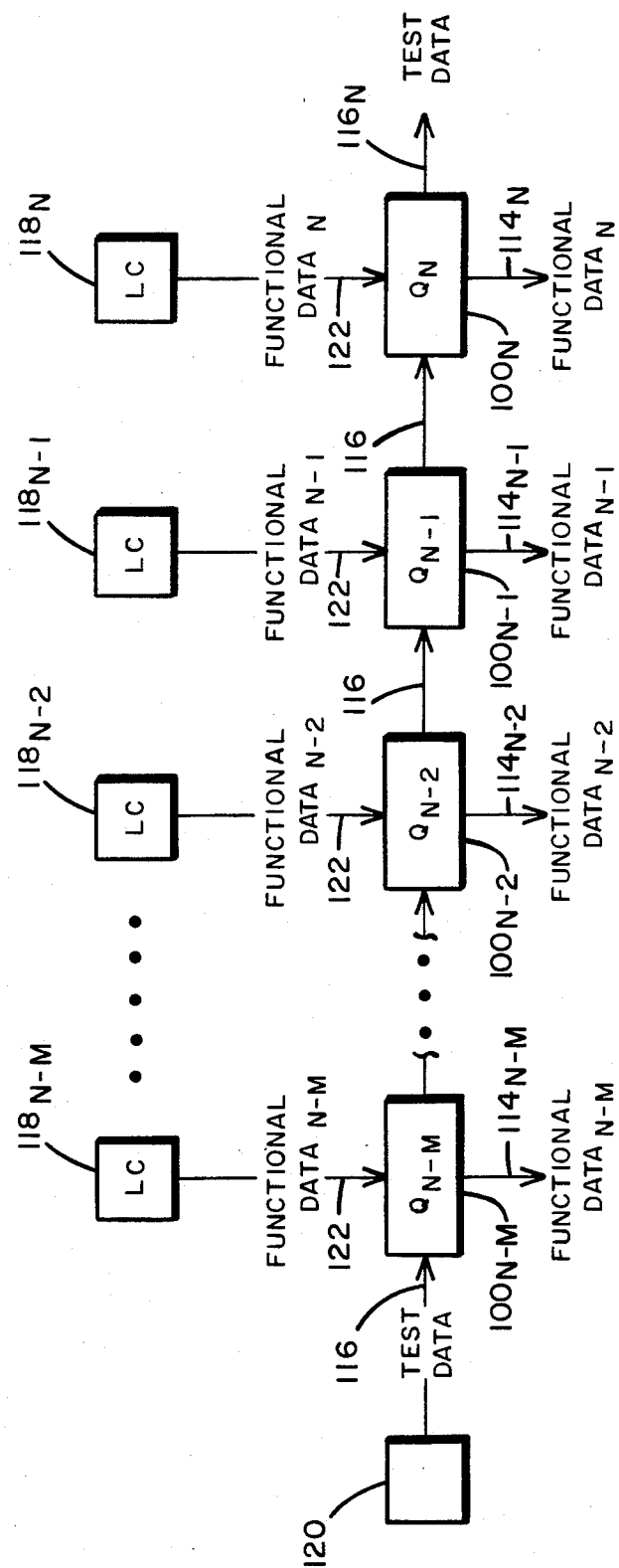
FIG. 7 is an illustration of a configuration of a plurality of the latch cells of FIG. 6 when coupled in a shift register latch (SRL) configuration.

With particular reference to FIG. 7 there is illustrated a typical configuration of a plurality of latch cells 100 coupled in a shift register latch (SRL) configuration. In normal functional mode, the latch cells $100_N$–$100_{N-M}$ receive, in parallel, the input (functional) Data $D_F$ from the respectively associated logic circuits $118_N$–$118_{N-M}$. The functional data are stored in the respectively associated static functional latches 102, and then are coupled, as output functional data $Q_F$, in parallel, to the respectively associated functional data out line 114. In the test mode, the functional data stored in the static functional latch 102 of the latch cells 100 are coupled in parallel to the respectively associated dynamic test latches 104. The functional data are then shifted seriatim through the latch cells $100_N$–$100_{N-M}$ to be output on test data out line $116_N$. A series of test data bits $D_T$ may be coupled to the latch cell $100_{N-M}$ from test data source 120 to be serially, in seriatim with the functional data, output on test data out line $116_N$. Such a method of operation is illustrated in the timing diagram of FIG. 8.

Figure 8:
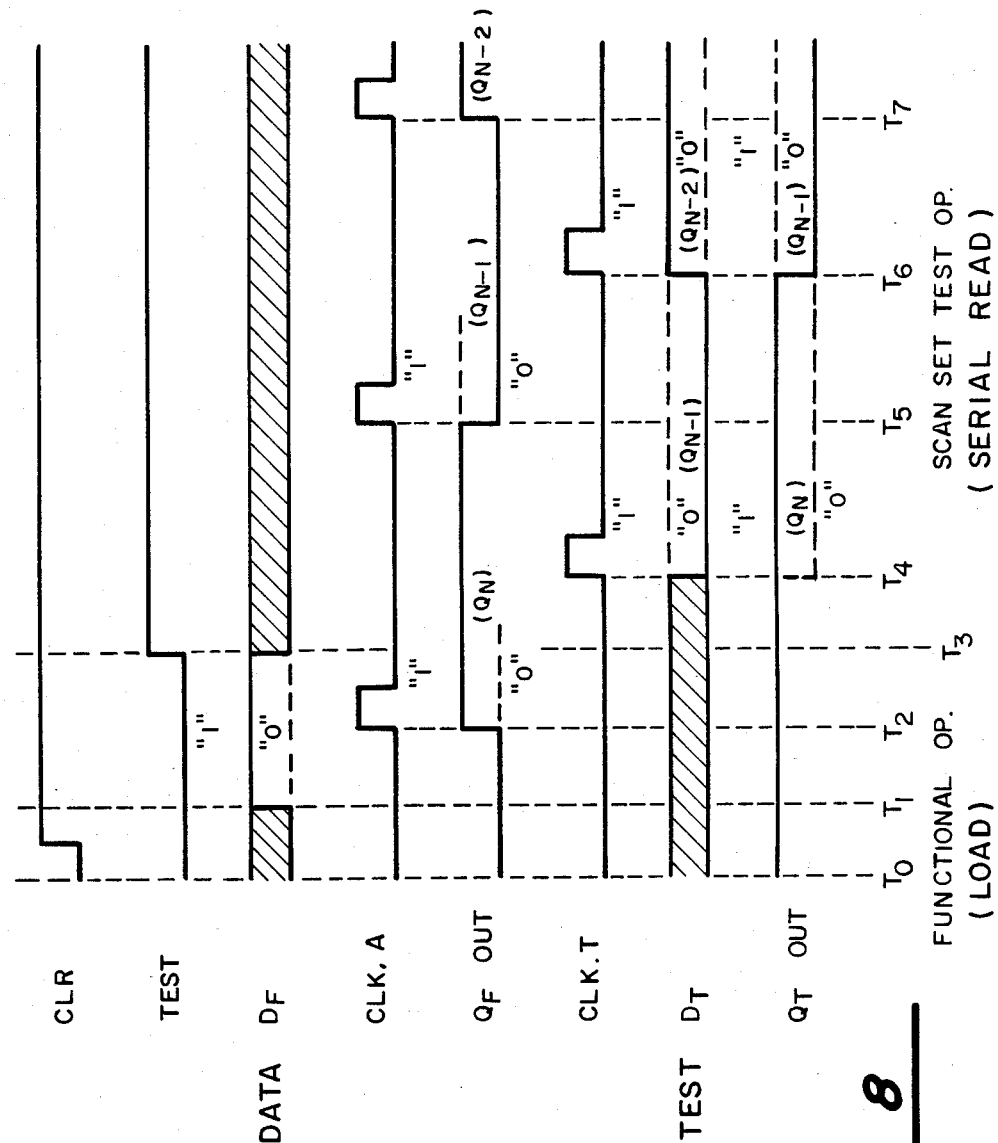
FIG. 8 is an illustration of a timing diagram that is applicable to the latch cell of FIG. 6.

A typical operation of the latch cell 100 of FIG. 6 when configured into the SRL of FIG. 7 is illustrated by the timing diagram of FIG. 8. Initially, as at a time $t_0$, latch cell 100 is Cleared by a prior Lo Clear signal CLR on line 122—see FIG. 6. At time $t_1$, with a Hi CLR signal coupled to line 122 and with a Lo Test signal coupled to line 124 (and, conversely, a Hi complementary Test signal coupled to line 125), the Data signal $D_F$ that is coupled to line 126 (Hi→1, Lo→0) is passed through ON transfer gate 110 of data selector 106 to node 128.

Next, at time $T_2$, a Hi CLK A signal is coupled to line 130 (and, conversely, a Lo complementary CLK A signal is coupled to line 131). This turns transfer gate 132 ON and transfer gate 134 OFF passing the Data signal $D_F$ at node 128 to node 136, through the double inverter configuration from node 136 ($D_F$) to node 138 ($\overline{D_F}$) to node 140 ($D_F$) and thence to OFF transistor gate 134. The Data signal $\overline{D_F}$ is also coupled to inverter 108 via line 142 to be output at functional data out line 114 as $Q_F$. Dynamic test latch 104 is at this time in a pre-test condition and nonsignificant test data $Q_T$ is on out line 116.

When CLK A signal again goes Lo, transfer gate 132 goes OFF and transistor gate 134 goes ON coupling the Data signal $Q_F$ at node 140 back to node 136. This causes functional latch 102 to operate as a static latch as long as the CLK A signal is Lo and the CLR signal is Hi. Simultaneously, the Data signal $D_F$ at node 138 is coupled: via line 142 to inverter 108 to output the data signal $Q_F$ on functional data outline 114; and, via line 144 to test latch 104.

At Time $T_3$, the Test signal on line 124 goes Hi turning ON transfer gate 112 and turning OFF transfer gate 110. This blocks the coupling of the DATA signal $D_F$ on line 126 to node 128, but continuously, from time $T_3$ onward, couples the Test signal $D_T$ on line 150 to node 128. However, the Data signal $D_F$ remains stored in the static functional latch 102 from time $T_3$ to time $T_5$.

At time, $T_4$, the CLK T signal coupled to line 146 goes Hi (and conversely, a Lo complementary CLK T signal is coupled to line 147). This enables the Data signal $\overline{D_F}$ that is coupled to line 144 and node 138 to be passed through transfer gate 148 of dynamic test latch 103 to be complemented by the inverter circuit at node 149 and to be output on test data out line 116 $Q_T$. Accordingly, at time $T_4$ and until time $T_6$, the functional data $Q_F$ is output at the test data out line 116.

At time $T_5$, a Hi CLK A signal is coupled to line 130. Transfer gate 132 is turned ON and transfer gate 134 is turned OFF. When the Hi Test signal is continuously coupled to line 124, as for time $T_3$, the Data signal $D_F$ coupled to line 126 is disabled or blocked from entry into static functional latch 102 while the Test signal $D_T$ coupled to line 150 is enabled to be entered into static functional latch 102 upon any subsequent coupling of a Hi CLK A signal to line 130. At this time $T_5$, the Test Signal $D_T$ coupled to line 150 is stored in static functional latch 102 and output on functional data out line 114 as $Q_F$ while the prior, Clocked at time $T_2$, Data signal $D_F$ is being output on test data out line 116 as $Q_T$.

At time $T_6$, the CLK T signal coupled to line 146 goes Hi. This enables the Test signal $D_T$ that was stored in static functional latch 102 at time $T_5$ to be passed through transfer gate 148 to be output on test data out line 116 as $Q_T$.

Subsequent alternate coupling of a Hi CLK A signal to line 130 and of a Hi CLK T signal to line 146 will gate the Test signal on $D_T$ coupled to line 150 into the static functional latch 102, at Hi CLK A signal time, and thence into the dynamic test latch 104, at Hi CLK T signal time, and output on test signal out line 116 as $Q_T$.

In the operation of a plurality of latch cells 100 coupled in the shift register patch (SRL) configuration of FIG. 7, the $N-M$ functional data $D_F$ bits will be transferred in parallel from the logic circuits $118_N$ through $118_{N-M}$ into their respectively associated latch cells $100_N$ through $100_{N-M}$. The N functional $D_F$ bits could be shifted through the SRL from the upstream latch cell $100_{N-M}$ into the downstream latch cell $100_N$ and out the test data outline $116_N$ followed by a serial stream of test data $D_T$ bits from test data source 120. Alternatively the serial stream of test data $D_T$ bits from test data source 120 could be shifted through the SRL from test data source 120 into latch cell $100_{N-M}$ through latch cell $100_N$ and out line test data line $116_N$.

It is apparent that applicant has disclosed herein a novel level sensitive scan design latch cell that includes a static functional latch in a dynamic test latch.

What is claimed is:

1. A level sensitive scan design latch cell comprising:
a static functional latch;
a data selector;
means for coupling said data selector to said static functional latch;
a dynamic test latch;
means for coupling said static functional latch to said dynamic test latch;
means for coupling successive bits of a serial string of test data bits to said data selector;
means coupled to said data selector for gating said successive bits of a serial string of test data bits from said data selector to said static functional latch and then to said dynamic test latch for being serially output by said dynamic test latch.

2. A level sensitive scan design latch cell comprising:
a static functional latch;
a data selector;
means for coupling said data selector to said static functional latch;
a dynamic test latch;
means for coupling said static functional latch to said dynamic test latch;
means for coupling a functional data bit and successive bits of a serial string of test data bits to said data selector;
means coupled to said data selector for gating said functional data bit to said static functional latch to be output therefrom or, alternatively, gating said successive bits of a serial string of test data bits to said static functional latch and then to said dynamic test latch for being serially output by said test latch.

3. A level sensitive scan design latch cell, comprising:
static functional latch means
dynamic test latch means;
data selector means;
means for coupling a functional data bit to said data selector means;
means for coupling a serial string of test data bits to said data selector means;
means for coupling said data selector means to said static functional latch means;
means for coupling said static functional latch means to said dynamic test latch means;
means for coupling control signals to said data selector means;
said control signals enabling said data selector means to alternatively couple
said functional data bit to said static functional latch means and to be output therefrom as a functional data bit, or
said serial string of test data bits to said static functional latch means and thence to said dynamic test latch and to be output therefrom as a serial string of test data bits.

* * * * *